(12) United States Patent
Pohm

(10) Patent No.: US 6,674,664 B2
(45) Date of Patent: Jan. 6, 2004

(54) CIRCUIT SELECTED JOINT MAGNETORESISTIVE JUNCTION TUNNELING-GIANT MAGNETORESISTIVE EFFECTS MEMORY CELLS

(75) Inventor: Arthur V. Pohm, Ames, IA (US)

(73) Assignee: NVE Corporation, Eden Prairie, MN (US)

( * ) Notice: Subject to any disclaimer, the term of this patent is extended or adjusted under 35 U.S.C. 154(b) by 40 days.

(21) Appl. No.: 10/137,177

(22) Filed: May 2, 2002

(65) Prior Publication Data

US 2002/0171100 A1 Nov. 21, 2002

Related U.S. Application Data

(60) Provisional application No. 60/289,162, filed on May 7, 2001.

(51) Int. Cl.[7] ............................................. G11C 11/15
(52) U.S. Cl. ........................................ 365/173; 365/171
(58) Field of Search ............................... 365/173, 171, 365/158, 161

(56) References Cited

U.S. PATENT DOCUMENTS

| | | | |
|---|---|---|---|
| 5,343,422 A | 8/1994 | Kung et al. ................ 365/173 |
| 5,347,485 A | 9/1994 | Taguchi et al. ............. 365/171 |
| 5,477,482 A | 12/1995 | Prinz ......................... 365/129 |
| 5,541,868 A | 7/1996 | Prinz ......................... 365/98 |
| 5,640,343 A | 6/1997 | Gallagher et al. .......... 365/171 |
| 5,650,958 A | 7/1997 | Gallagher et al. .......... 365/173 |
| 5,734,605 A | 3/1998 | Zhu et al. ................... 365/173 |
| 5,764,567 A | * 6/1998 | Parkin ........................ 365/173 |
| 5,841,692 A | * 11/1998 | Gallagher et al. .......... 365/173 |
| 5,949,707 A | 9/1999 | Pohm et al. ................ 365/158 |
| 5,966,322 A | 10/1999 | Pohm et al. ................ 365/158 |
| 5,978,257 A | 11/1999 | Zhu et al. ................... 365/173 |
| 6,021,065 A | 2/2000 | Daughton et al. .......... 365/158 |
| 6,124,711 A | 9/2000 | Tanaka et al. .............. 324/252 |
| 6,147,900 A | 11/2000 | Pohm ......................... 365/158 |
| 6,166,948 A | * 12/2000 | Parkin et al. .............. 365/173 |
| 6,275,411 B1 | 8/2001 | Daughton et al. .......... 365/158 |
| 6,295,225 B1 | * 9/2001 | Oepts ......................... 365/171 |
| 6,473,337 B1 | * 10/2002 | Tran et al. .................. 365/173 |
| 6,538,921 B2 | 3/2003 | Daughton et al. |

OTHER PUBLICATIONS

A. Veloso and P.P. Freitas. Spin Valve Sensors with Synthetic Free and Pinned Layers. *Journal of Applied Physics.* vol. 87, No. 9, 5744–5746, May 1, 2000.

A. Veloso, P.P. Freitas, and L.V. Melo. Spin Valves with Synthetic Ferrimagnet and Antiferromagnet Free and Pinned Layers. IEEE Trans. Magn. 35, 2568 (1999).

V.S. Speriosu, B.A. Gurney, D.R. Wilhoit, and L.B. Brown. Spin Valves with Synthetic Ferrimagnets. Presented at Intermag '96.

* cited by examiner

*Primary Examiner*—Anh Phung
(74) *Attorney, Agent, or Firm*—Kinney & Lange, P.A.

(57) ABSTRACT

A ferromagnetic thin-film based digital memory including a memory cell having a bit structure with a nonmagnetic intermediate layer having a memory film of an anisotropic ferromagnetic material on each of the opposite side major surfaces of an intermediate layer with there being a film thickness difference there of at least five percent, or a film effective anisotropy field difference because of different ferromagnetic materials used therefor, or both. An electrically insulative intermediate layer is provided on the memory film across from one intermediate layer major surface, this insulative intermediate layer having a major surface on a side opposite the memory film on which a magnetization reference layer is provided having a relatively fixed magnetization direction. Manipulation circuitry coupled to the bit structure selectively substantially prevents current in at least one direction along a current path through that bit structure, and permit selecting the occurrence of current flow through the bit structure if to be permitted at a selected time.

50 Claims, 5 Drawing Sheets

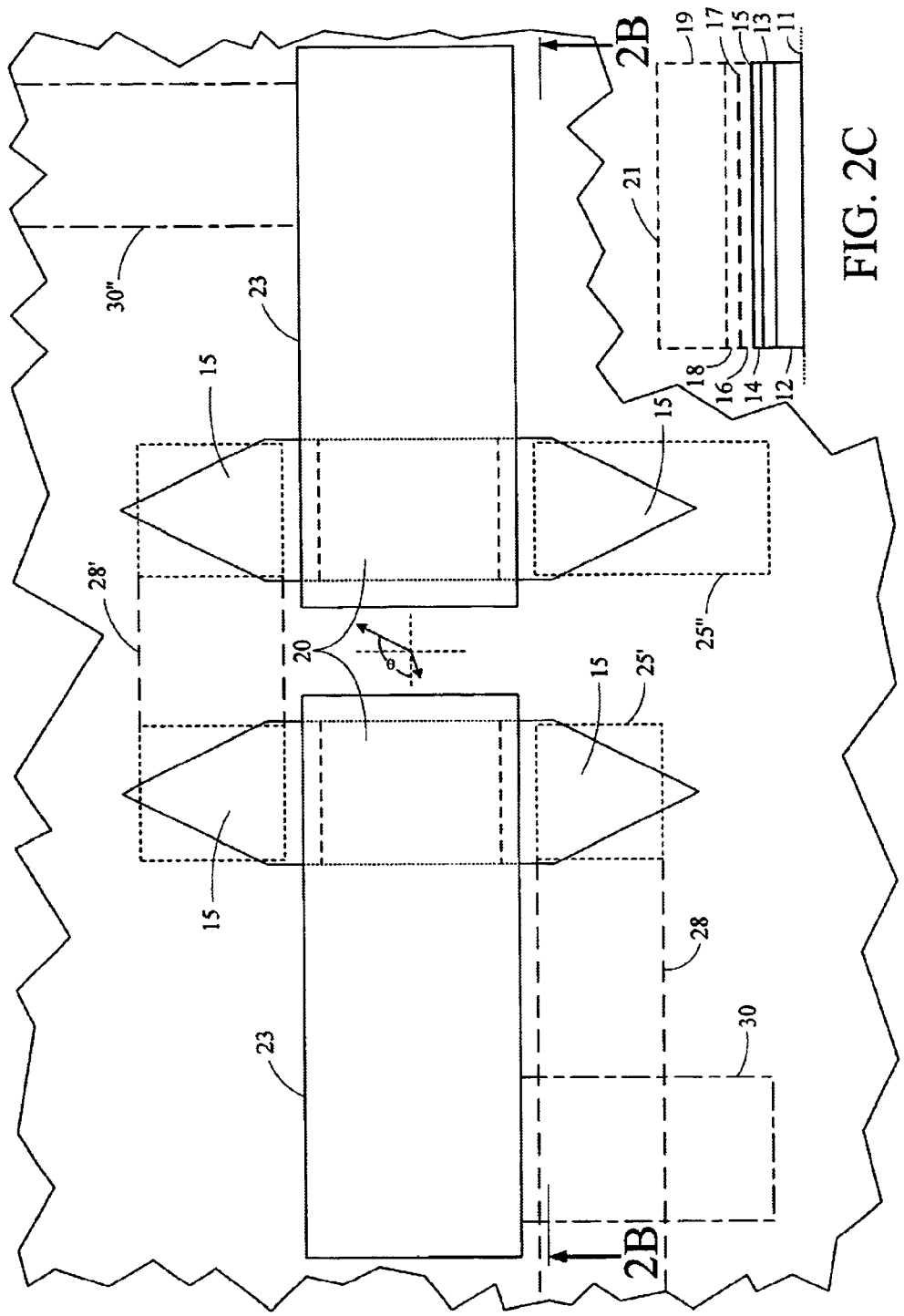

CIRCUIT SELECTED JOINT MAGNETORESISTIVE JUNCTION TUNNELING-GIANT MAGNETORESISTIVE EFFECTS MEMORY CELLS

CROSS-REFERENCE TO RELATED APPLICATION

This application claims the benefit of Provisional Application No. 60/289,162 filed May 7, 2001 for "CIRCUIT SELECTED JOINT MAGNETORESISTIVE JUNCTION TUNNELING-GIANT MAGNETORESISTIVE EFFECTS MEMORY CELLS".

BACKGROUND OF THE INVENTION

The present invention relates to ferromagnetic thin-film structures exhibiting relatively large magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

A memory cell based on the "giant magnetoresistive effect" can be provided by having one of the ferromagnetic layers in the "sandwich" construction being prevented from switching the magnetization direction therein from pointing along the easy axis therein in one to the opposite direction in the presence of suitable externally applied magnetic fields while permitting the remaining ferromagnetic layer to be free to do so in the same externally applied fields. In one such arrangement, a "spin-valve" structure is formed by providing an antiferromagnetic layer on the ferromagnetic layer that is to be prevented from switching in the externally applied fields to "pin" its magnetization direction in a selected direction. In an alternative arrangement often termed a "pseudo-spin valve" structure, the ferromagnetic layer that is to be prevented from switching in the externally applied fields is made sufficiently thicker than the free ferromagnetic layer so that it does not switch in those external fields provided to switch the free layer.

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

An alternative digital data bit storage and retrieval memory cell suited for fabrication with submicron dimensions can be fabricated that provides rapid retrievals of bit data stored therein and low power dissipation memory through use of a cell structure that has a spin dependent tunneling junction (SDTJ), or magnetoresistive tunnel junction (MTJ), device therein based on a pair of ferromagnetic thin-film layers having an electrical insulator layer therebetween of sufficient thinness to allow tunneling currents therethrough. This memory cell can be fabricated using ferromagnetic thin-film materials of similar or different kinds in each of the magnetic memory films present in such a "sandwich" structure on either side of an intermediate nonmagnetic layer where such ferromagnetic films maybe composite films, but this intermediate nonmagnetic layer conducts electrical current therethrough based primarily on the quantum electrodynamic effect "tunneling" current mentioned above.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance or conductance characterizing this intermediate layer with respect to the "tunneling" current therethrough. In addition, an antiferromagnetic layer against one of the ferromagnetic layers is used in such a cell to provide different magnetization switching thresholds between that ferromagnetic layer and the other by fixing, or "pinning", the magnetization direction for the adjacent ferromagnetic layer while leaving the other free to respond to externally applied fields. Such devices may be provided on a surface of a monolithic integrated circuit to thereby allow providing convenient electrical connections between each such memory cell device and the operating circuitry therefor.

Such a "sandwich" structure in this kind of a memory cell that is relatively long in the Cartesian coordinate y with respect to its width in the Cartesian coordinate x, and based on having an intermediate thin layer of a nonmagnetic, dielectric separating material with two major surfaces on each of which a anisotropic ferromagnetic thin-film is positioned with an induced easy axis parallel to the width, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized cell structure.

An approximation to determine the cell SDT junction switching magnetic field threshold and associated current for a cell small enough to have single domain ferromagnetic layers can be obtained from minimizing the cell free energy which is equivalent to setting the magnetic torque, $T_{q1}$, on the free layer to zero for that layer having a magnetic saturation of $M_s$, or $$0 = T_{q1} = -M_s H_{k1} \sin\theta_1 \cos\theta_1 + M_s H_s S_{f1} \sin\theta_1 - M_s H_{cp} \sin\theta_1 + M_s H_{demagx1} \cos\theta_1 \sin\theta_1 + M_s H_w \cos\theta_1 - M_s H_{demagy1} \cos\theta_1.$$

In this equation, $H_{demagx1}$ is the maximum demagnetizing field across the width of the cell junction free layer with $H_{demagx1} = 4\pi M_s T/(T+W)$ where T is the free layer thicknesses and W is the cell junction width in Angstroms;

$H_{demagy1}$ is the maximum demagnetizing field across the width of the cell junction free layer with $H_{demagy1} = RH_{demagx1}$ where R is the ratio of the demagnetization field along the layer to that across the layer determined by the cell junction shape;

$H_{k1}$ is the effective anisotropy field;

$H_s$ is the maximum value of the sense field (at outer edges, i.e. the layer outer major surfaces) provided by a sense current through the cell parallel to the cell barrier;

$S_{f1}$ is the fraction of the maximum sense field that characterizes the average sense field through the thickness of a layer calculated from the layer conductivity;

$H_w$ is an externally applied magnetic field along the cell junction length resulting from a current established in a conductor (word line);

$H_{cp}$ is the effective coupling field arising from facing ferromagnetic layers uneven surface textures, or "orange peel" effect, with the coupling taken as being from the "pinned" layer to the free layer; and $\theta_1$ is the angle of the layer magnetization away from the easy axis that is across the width of the cell junction and antiparallel to the magnetization direction of the "pinned" layer absent applied fields.

Thus, after substitution, the foregoing equation can be rewritten as $$0 = T_{q1} = -M_s H_{k1} \sin\theta_1 \cos\theta_1 + M_s H_s S_{f1} \sin\theta_1 - M_s H_{cp} \sin\theta_1 + M_s 12500 \frac{T}{T+W} \cos\theta_1 \sin\theta_1 + M_s H_w \cos\theta_1 - M_s H_{demagy1} \cos\theta_1,$$

thereby showing the layer geometry dependence. The switching threshold can be found from this latter equation by increasing the magnetic fields in small increments until the magnetization of the free layer switches to the opposite direction, and from the values of these fields at that point the currents to provide them can be determined.

As stated above, operating magnetic fields imposed externally can be used to vary the angle of the magnetization vector with respect to the easy axis in the ferromagnetic films of these various kinds of memory cell devices. Such operational magnetic fields imposed externally can be used to vary the angle to such an extent as to cause switching of the film magnetization vector between two stable states which occur for the magnetization being oriented in opposite directions along the film's easy axis, the state of the cell determining the value of the binary bit being stored therein. One of the difficulties in such memories is the need to provide memory cells therein that have extremely uniform switching thresholds and adequate resistance to unavoidable interjected magnetic field disturbances in the typical memory cell state selection scheme used. This scheme is based on selective externally imposed magnetic fields provided by selectively directing electrical currents over or through sequences of such cells so that selection of a cell occurs through coincident presences of such fields at that cell.

Such a coincident interjected magnetic fields memory cell state selection scheme is very desirable in that an individual switch, such as that provided by a transistor, is not needed for every memory cell, but the limitations this selection mode imposes on the uniformity of switching thresholds for each memory cell in a memory make the production of high yields difficult. The stability of data in memory cells in magnetoresistive random access memories (MRAM) can be improved by using circuit switching selection of the cells rather than word line and sense line coincident current selection of the cells. One memory cell structure for such an arrangement has a spin dependent tunneling junction (SDTJ), or magnetoresistive tunnel junction (MTJ), device, based on a pair of ferromagnetic thin-film layers having an electrical insulator layer therebetween of sufficient thinness to allow tunneling currents therethrough, but with one of these ferromagnetic layers effectively replaced by a substituted "sandwich" structure formed with an intermediate separating material having two major surfaces on each of which an anisotropic ferromagnetic memory thin-film is provided.

Such a "sandwich" structure can be formed, for instance, as an anisotropic magnetoresistive (AMR) effect device in which the electrical resistance is at least partly determined by the angle between the direction of current therethrough and the direction of film magnetization or as a giant magnetoresistive (GMR) effect device in which the electrical resistance is at least partly determined by the angle between the directions of the two film magnetizations. That is, in this latter situation for example, one of the ferromagnetic thin-film layers in the spin dependent tunneling device is formed, instead of by a single or stratified ferromagnetic layers, a pair of sufficiently thin ferromagnetic thin-film layers separated by a sufficiently thin nonmagnetic material layer such as an electrical conductor to result in an integrated GMR tunneling device memory cell, a cell in which both integrated devices are typically formed several times longer than wide.

Such an arrangement allows for the use of much smaller electrical currents in forming magnetic fields to cause the storing of data bits in the cell so formed because substituted "sandwich" structures take less current to have the magnetizations of the ferromagnetic thin-film layers therein switched from one magnetization state to the opposite state than would a single or stratified ferromagnetic thin-film layer. One contributing factor to this result is the magnetic flux path closure provided by the two ferromagnetic thin-film layers in the substitute "sandwich" structure leading to reduced demagnetization fields in those ferromagnetic layers to be overcome in switching the magnetization states of such ferromagnetic layers therein.

A similar approximation to that above can again be used to determine the resulting cell substitute "sandwich" structure switching magnetic fields threshold and associated currents by again minimizing the device free energy for a cell small enough to have single domain cell substitute "sandwich" structure ferromagnetic layers. Such a minimization is equivalent to setting the magnetic torques, $T_{q1}$ (layer closest to junction) and $T_{q2}$ (layer further from junction), on the substitute "sandwich" structure ferromagnetic layers each to zero where each layer has a magnetic saturation $M_s$, or $$0 = T_{q1} = -M_s H_{k1} \sin\theta_1 \cos\theta_1 + M_s H_s S_{f1} \sin\theta_1 - M_s H_{cp} \sin\theta_1 + M_s H_{demagx1} \sin\theta_1 + M_s H_w \cos\theta_1 - M_s H_{demagy1} \cos\theta_1,$$

and $$0 = T_{q2} = -M_s H_{k2} \sin\theta_2 \cos\theta_2 + M_s H_s S_{f2} \sin\theta_2 + M_s H_{demagx2} \sin\theta_2 + M_s H_w \cos\theta_2 - M_s H_{demagy2} \cos\theta_2.$$

In these equations, $H_{demagx1}$ and $H_{demagx2}$ are the effective demagnetizing fields across the widths of the corresponding ones of the cell substitute "sandwich" structure layers with $H_{demagx1} = H_{dx1} \cos\theta_1 - H_{dx2} \cos\theta_2$ and with $H_{demagx2} = H_{dx2} \cos\theta_2 - H_{dx1} \cos\theta_1$ where $H_{dx1} = 4\pi M_s T_1/(T_1+W)$ and $H_{dx2} = 4\pi M_s T_2/(T_2+W)$ are the maximum demagnetizing fields across the widths of the corresponding ones of the cell substitute "sandwich" structure layers which are identical for $T_1 = T_2$, and $H_{demagy1}$ and $H_{demagy2}$ are the effective demagnetizing fields across the lengths of the corresponding ones of the cell GMR effect device layers with $H_{demagy1} = H_{demagy2} = Hd_{y1} \sin\theta_1 + Hd_{y2} \sin\theta_2$ where $Hd_{y1} = RH_{dx1}$ and $Hd_{y2} = RH_{dx2}$ are the maximum demagnetizing fields across the lengths of the corresponding ones of the cell substitute "sandwich" structure layers and R is the ratio of the demagnetization field along either layer to that across that layer as determined by the cell substitute "sandwich" structure shape;

$H_{k1,2}$ are the effective anisotropy fields in the corresponding ones of the cell substitute "sandwich" structure layers, and are substantially equal for the same materials being used in each layer;

$H_s$ is the maximum value of the sense field (at outer edges, i.e. the outer major surfaces of the cell substitute "sandwich" structure layers thereby resulting in one major surface from each layer being referenced) provided by a sense current through the cell, including through the substitute "sandwich" structure, parallel to the cell barrier;

$S_{f1,2}$ is the fraction of the maximum sense field that characterizes the average sense field through the thickness of a corresponding one of the cell substitute "sandwich" structure layers calculated from the layer conductivity;

$H_w$ is a possible externally applied magnetic field along the cell length resulting from a current established in a conductor (word line) if provided at all;

$H_{cp}$ is the effective coupling field arising from facing ferromagnetic layers uneven surface textures, or "orange peel" effect, with the coupling being from the cell substitute "sandwich" structure layer further from the junction to the layer closer thereto; and $\theta_{1,2}$ are angles of corresponding ones of the cell substitute "sandwich" structure layer magnetizations away from the easy axes that are across the widths of those layers and antiparallel to one another absent applied magnetic fields.

Again, the switching threshold can be found from these equations by increasing the magnetic fields in small increments until the magnetization of the free layer switches to the opposite direction, and from the values of these fields at that point the currents to provide them can be determined. These threshold currents will be significantly less than those found above for the cell junction device alone because the maximum demagnetization fields for the cell substitute "sandwich" structure layers in place of the single free layer in the cell junction device will be so much less due to the flux path closure provided by the cell substitute "sandwich" structure layers, these two equally thick ferromagnetic layers about the nonmagnetic intermediate layer of thickness g having a joint demagnetization field of approximately $16\pi M_s Tg/W^2$. Nevertheless, there is a strong desire to further reduce the operating currents needed with such a memory cell.

BRIEF SUMMARY OF THE INVENTION

The present invention provides a ferromagnetic thin-film based digital memory including a memory cell having a bit structure with a nonmagnetic intermediate layer exhibiting two major surfaces on opposite sides thereof and a memory film of an anisotropic ferromagnetic material on each of the intermediate layer major surfaces with a film thickness difference there of at least five percent, or a film effective anisotropy field difference because of different ferromagnetic materials used therefor, or both. An electrically insulative intermediate layer is provided on the memory film and across said memory film from one of the intermediate layer major surfaces, this intermediate layer having a major surface on a side opposite the memory film on which a magnetization reference layer is provided having a relatively fixed magnetization direction. Manipulation circuitry has a plurality of transistors coupled to the bit structure that selectively substantially prevents current in at least one direction along a current path through that bit structure, and includes switching transistors to permit selecting the occurrence of current flow through the bit structure if to be permitted at a selected time.

BRIEF DESCRIPTION OF THE DRAWINGS

FIGS. 2A, 2B and 2C show memory cell structures of the present invention.

DETAILED DESCRIPTION

Figure 1:
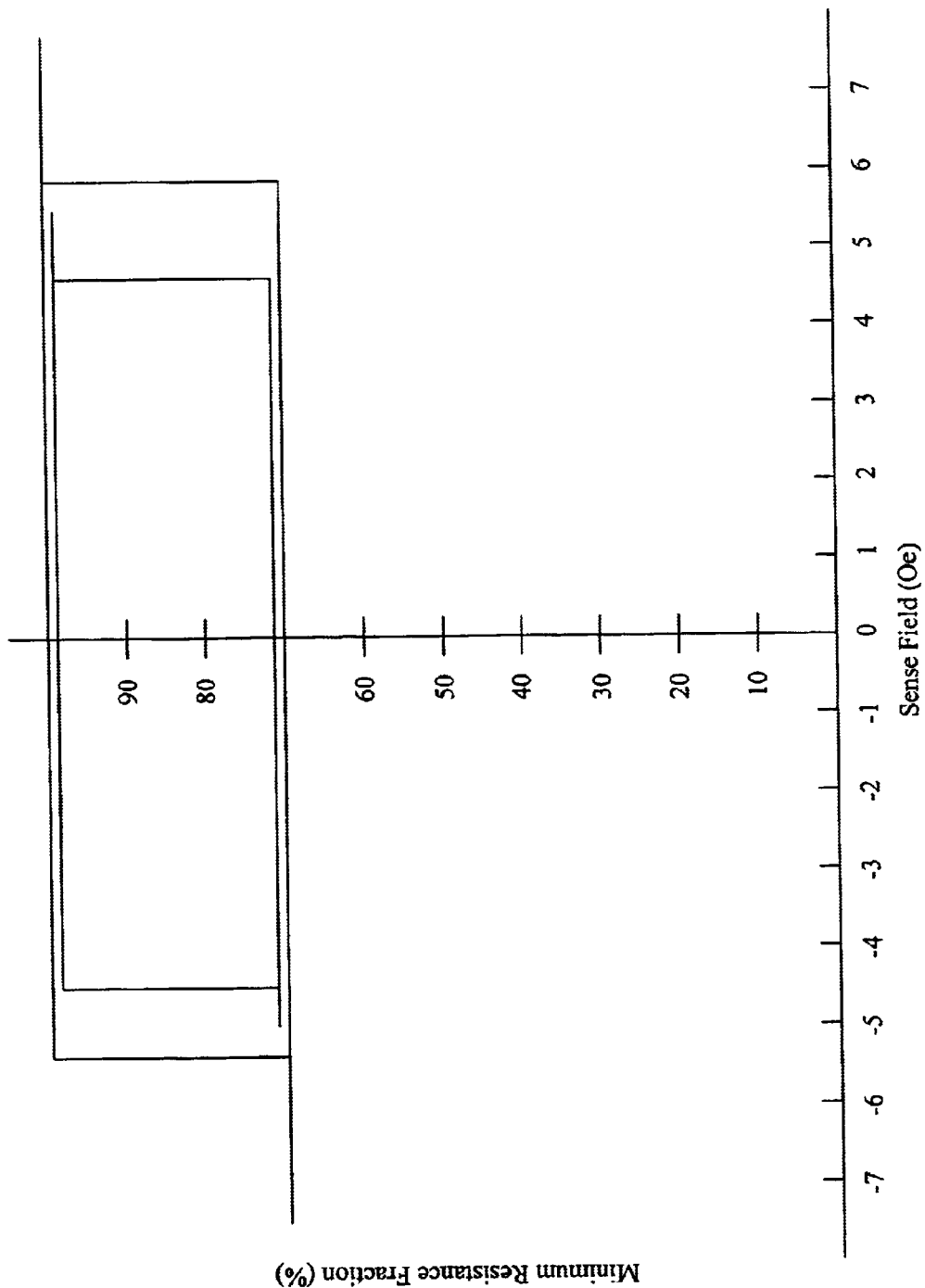
FIG. 1 shows a graph with plots representing the behavior of a joint barrier and separated paired magnetic layers memory cell with slight and substantial paired magnetic layers differences.

The needed magnitudes of storage currents through the giant magnetoresistive effect device in such an integrated device memory cell can be further reduced if the thickness of that one of the two ferromagnetic thin-film layers therein not adjacent to the spin dependent tunneling device is substantially increased over the thickness of that remaining ferromagnetic thin-film layer in the giant magnetoresistive effect device that is adjacent to, and part of, the spin dependent tunneling device. If this latter ferromagnetic thin-film is thinner than the former though made of the same magnetic material to have the same saturation magnetization, and the easy axis is induced across the width of the giant magnetoresistive effect device, the thicker ferromagnetic film will have a magnetization that will not be perpendicular to the edge of the device crossed by the easy axis thereof because of the shape anisotropy of the thicker film relative to the field induced anisotropy thereof forming the easy axis whereas the magnetization of the thinner film will lie close to being parallel with its easy axis. That is, where the induced anisotropy along the easy axis is smaller than the effective shape anisotropy, the thinner ferromagnetic film will switch between rest states in opposite directions approximately parallel with the easy axis, and the thicker ferromagnetic film will have a magnetization rotated to an angle forced by the shape anisotropy thereof which results in the magnetic flux around the ends of the device tending to follow a closed magnetic flux path.

However, this effect is offset in part because of the greater conductance of the thicker layer leading to more of the sense current being in it than in the thinner layer so that the resulting reduced current in the thinner layer generates less magnetic field to rotate the magnetization of the thicker layer. This offset can be countered, on the other hand, by adding molybdenum in the thicker layer to thereby increase the layer resistivity, and do so with very little change in the layer magnetic parameters.

An even greater reduction in the needed magnitudes of storage currents through the giant magnetoresistive effect device of the cell can be achieved if the effective anisotropy field associated with the easy axis for the one of the two ferromagnetic thin-film layers therein not adjacent to the spin dependent tunneling device is substantially reduced over the effective anisotropy field of that remaining ferromagnetic thin-film layer in the giant magnetoresistive effect device that is adjacent to, and part of, the spin dependent tunneling device. If this latter ferromagnetic thin-film is thinner than the former and made of a different magnetic material having a relatively greater effective anisotropy field, and the easy axis is again induced across the width of the giant magnetoresistive effect device, the thicker ferromagnetic film will have a magnetization that will not be perpendicular to the edge of the device crossed by the easy axis thereof both because of the shape anisotropy of the thicker film relative to the field induced anisotropy thereof forming the easy axis and because of the lower effective anisotropy there (the cumulative effect of both causes), whereas the magnetization of the thinner film will lie close to being parallel with its easy axis.

The results of significant differences in the two ferromagnetic layers in the giant magnetoresistive effect device of the cell versus insignificant differences in those two layers is illustrated in the two corresponding magnetoresistance versus applied field switching characteristics shown for such devices in FIG. 1. These illustrative characteristics are calculated from equations like those above to determine the switching points but idealized in presenting the characteristics from those points as straight lines rather than calculating the entire characteristics which in detail would be more continuously curved near the corners. These results are for a substitute "sandwich" structure that is 1.0 μm wide with $M_{s1}$=1000 emu, $M_{s2}$=800 emu, $H_{k1}$=15 Oe, $H_{dx1}$=

$H_{dx2}$=50 Oe, $H_{dy1}$=$H_{dy2}$=1 Oe, $H_{cp}$=1 Oe, and $S_{f1}$=$S_{f2}$=0.85. In addition, the first ferromagnetic layer (layer 1) in this structure is 40 Å thick, the intermediate layer in this structure is 50 Å thick, and the second ferromagnetic layer (layer 2) in this structure is 50 Å thick, and a word line current based magnetic field is applied that is two thirds the applied sense current based magnetic field valued on the abscissa axis of the graph. The fractional values of the maximum magnetoresistance of the giant magnetoresistive effect device of the cell are values on the ordinate axis of the graph.

The outer characteristic in FIG. 1 is derived for $H_{k2}$=15 Oe thus resulting in the two ferromagnetic layers in the giant magnetoresistive effect device of the cell being very similar. The inner characteristic in FIG. 1, and thus the characteristic having lower sense current switching thresholds in being closer to zero, is derived for $H_{k2}$=0.0 Oe thus resulting in the two ferromagnetic layers in the giant magnetoresistive effect device of the cell being dissimilar with respect to the effective anisotropy fields of each. Clearly, dissimilar ferromagnetic layers in the giant magnetoresistive effect device of the cell can lower switching threshold values.

Figure 2B:
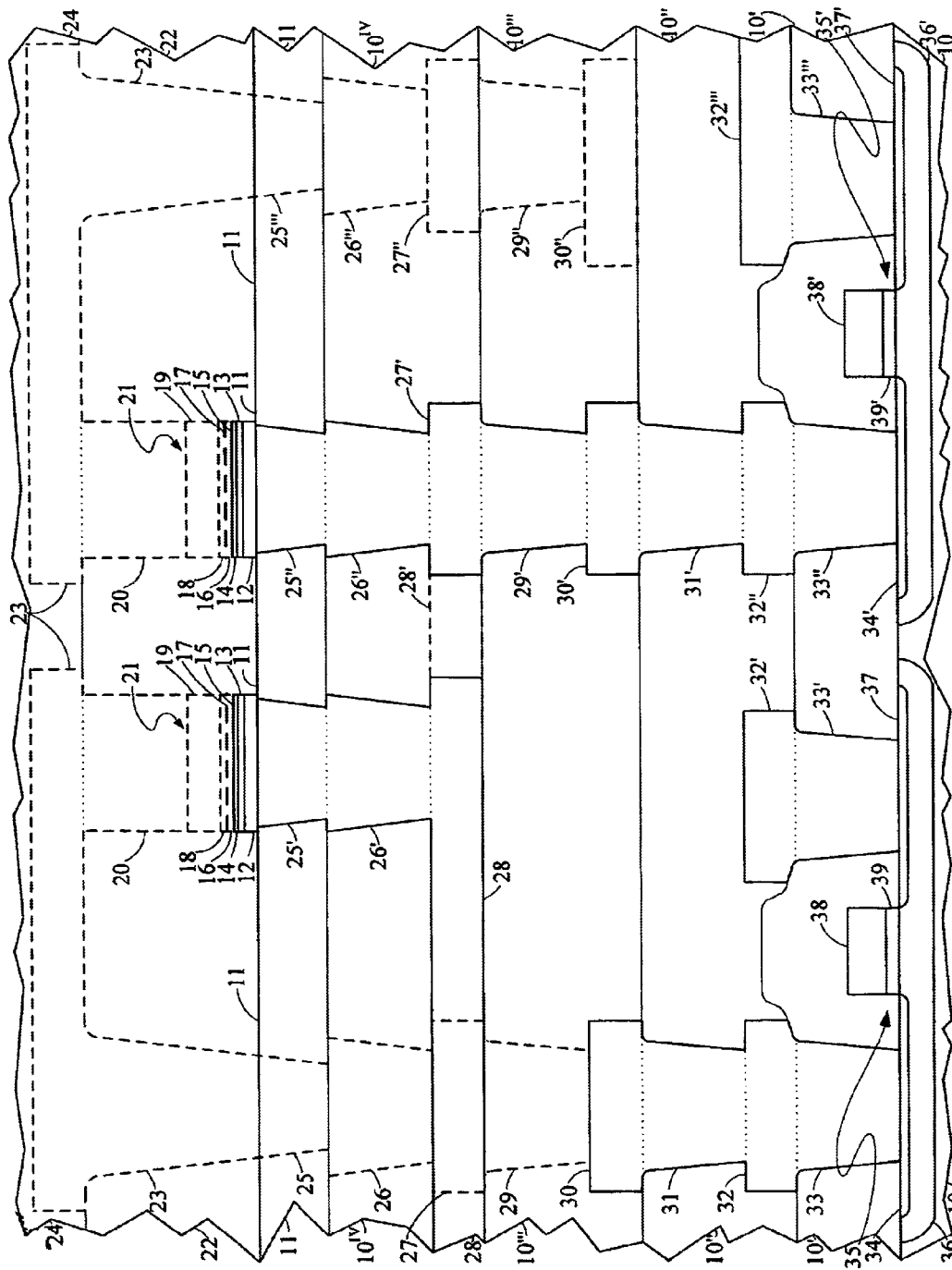

A pair of such jointly formed spin dependent tunneling-substitute "sandwich" structure devices, or integrated "sandwiches" tunneling device memory cells, and the controlled current paths immediately connected thereto are shown in FIGS. 2A and 2B, and an enlarged version of one such device is shown in FIG. 2C. FIG. 2A is a fragmentary top view of a structural region about these cell devices and the immediate electrical interconnections thereto. The uppermost interconnections to these cell devices and the portions of thereof outside these uppermost interconnections are shown in solid lines even though they are covered by a protective layer in the actual device structure as this protective layer has been omitted in this view for purposes of clarity. The section line shown in this view defines the location of the view taken in the fragmentary layer diagram of FIG. 2B showing the layered structure corresponding to the fragmentary structure shown in the top view of FIG. 2A. This layer diagram gives an indication of the structural layers leading to the structural portion shown in FIG. 2A, but FIG. 2B is not a true cross section view in that many dimensions there are exaggerated or reduced relative to one another for purposes of clarity.

As can be seen in FIG. 2B, the memory cell structures are provided on a semiconductor material monolithic integrated circuit chip serving as a substrate therefor and having electronic circuit component devices provided in the semiconductor material, 10, thereof as the substrate for the remaining portions of the integrated circuit itself. Those remaining portions of the monolithic integrated circuit shown in FIG. 2B above the semiconductor material 10 are a series of four electrical insulating layers, 10', 10", 10''', 10$^{iv}$, each typically formed of silicon dioxide. Each of the lower three of these electrical insulating layers have a metal circuit interconnection pattern supported thereon for electrically interconnecting selected ones of the circuit component devices therebelow in semiconductor material 10 and the integrated "sandwiches" tunneling devices provided thereabove.

Following chemical and mechanical polishing of the surface of last or uppermost electrical insulating layer 10$^{iv}$, and the opening of vias therein to provide metal interconnections to the interconnection layer therebelow, a further electrical insulating layer, 11, is formed on the resulting surface by sputter deposition and silicon nitride to a thickness of typically 1000 Å. The surface of layer 11 is then also chemically and mechanically polished to provide a resulting surface on which the integrated "sandwiches" tunneling devices are to be provided.

These integrated "sandwiches" tunneling devices are next provided by a series of layer depositions with portions of these deposited layers being later removed by ion milling to leave the desired device portions remaining on the upper surface of layer 11 with the results therefor shown both in FIGS. 2B and 2C, the latter figure being enlarged for clarity. The remaining portions will be designated with the same numerical designation as are used in describing the deposition layers from which each is formed. Thus, a first ferromagnetic thin-film layer, 12, is deposited on the exposed surface of layer 11. Layer 12 can be formed of an alloy comprising 65% nickel, 15% iron and 20% cobalt or a little less of each if 0 to 2% of molybdenum is to be added to the thicker layer to increase electrical resistivity so as to keep currents approximately equal in each ferromagnetic layer in the giant magnetoresistive effect device of the cell despite thickness differences. This material is chosen for layer 12 if substantially the same effective anisotropy field is to be maintained for both of the ferromagnetic thin-film layer to be provided in the substitute "sandwich" structure portion of the spin dependent tunneling-substitute "sandwich" structure devices, as this same material will be used in the other ferromagnetic thin-film layer yet to be provided in this "sandwich" structure. In this instance, then, only thickness differences are to be used to magnetically differentiate the presently deposited layer from that other ferromagnetic thin-film layer yet to be provided. Layer 12 is deposited to a thickness of a 120 Å in an easy axis orienting magnetic field directed from left to right, or right to left, in FIG. 2B across the width of the finally formed devices to induce the easy axis in this layer to lie in the plane of the figure.

If instead, magnetic differentiation between layer 12 and the other ferromagnetic thin-film layer yet to be provided in this "sandwich" structure is to be due only to effective anisotropy field differences, layer 12 can be formed of an alloy comprising 80% nickel and 20% iron deposited to a thickness of a 40 Å on the exposed surface of layer 11 as this same thickness that will be used in the other ferromagnetic thin-film layer yet to be provided in this "sandwich" structure. Here, too, layer 12 is deposited an easy axis orienting magnetic field directed from left to right, or right to left, in FIG. 2B across the width of the finally formed devices to induce the easy axis in this layer to lie in the plane of the figure.

Alternatively, both thickness and effective anisotropy field differences can be used to magnetically differentiate layer 12 from the other ferromagnetic thin-film layer yet to be provided in this "sandwich" structure by having layer 12 formed of an alloy comprising 80% nickel and 20% iron or a little less of each if 0 to 2% of molybdenum is to be added to the thicker layer to increase electrical resistivity so as to keep currents approximately equal in each ferromagnetic layer in the giant magnetoresistive effect device of the cell despite thickness differences. Layer 12 is deposited to a thickness of a 120 Å on the exposed surface of layer 11. In this circumstance, too, layer 12 is deposited an easy axis orienting magnetic field directed from left to right, or right to left, in FIG. 2B across the width of the finally formed devices to induce the easy axis in this layer to lie in the plane of the figure. The devices of FIGS. 2A, 2B and 2C will be described using this last alternative for layer 12.

Thereafter, an electrically conductive, but nonmagnetic, thin-film substitute "sandwich" intermediate layer, 13, of Ruthenium (Ru) which is deposited to a thickness of 50 Å. Ruthenium is chosen for this substitute "sandwich" intermediate layer to yield a smoother resulting exposed surface after its deposition, but copper or tantalum could alternatively be used.

This intermediate layer is followed by providing a further ferromagnetic thin-film layer, 14, again an alloy of 65% nickel, 15% iron and 20% cobalt deposited to a thickness of 40 Å. Thus, ferromagnetic thin-film layer 12 is approximately three times the thickness of ferromagnetic thin-film layer 14 as described above, and has and has an effective anisotropy field that is one-third to one-fourth that of layer 14, both for the purpose of allowing the use of lower sense currents to effect bit storage in the memory cell. The higher effective anisotropy field of layer 14 relative to that of layer 12 is due primarily to the increased crystal energy constants for that layer because of the choice of a different ferromagnetic material for that layer. As just described, an independent contribution for this purpose can be made by just providing the thickness difference between these two layers with each being of the same ferromagnetic material, or by just providing the different ferromagnetic materials for these two layers with each being of the same thickness, rather than obtaining a joint contribution by incorporating both of these differences between these two layers.

Layer 14 is again deposited in an easy axis orienting magnetic field to induce the easy axis in this layer to also lie in the plane of the figure. Layers 12, 13 and 14 together form the basis for a "sandwich" structure, which may be a giant magnetoresistive effect device, having ferromagnetic thin-film layers therein of substantially different thicknesses, and layer 14 will also be directly part of the spin dependent tunneling device next to be next completed through providing the remainder thereof as described below.

Next, a SDT intermediate layer, or barrier layer, 15, is provided by sputter deposition onto layer 14, this barrier layer being a dielectric and represented as a solid line in FIGS. 2B and 2C. Layer 15 is provided typically by sputter depositing 12 Å of aluminum onto layer 14, and continuing to provide two further angstroms of this material using the aluminum sputtering target but also introducing oxygen into the sputtering chamber. The result is to convert the already deposited aluminum layer substantially into aluminum oxide which expands its thickness by a factor of about 1.3, and to add another two angstroms of aluminum oxide thereto giving a barrier layer thickness of approximately 17.5 Å with this layer being formed primarily of aluminum oxide.

The provision of barrier layer 15 is followed by providing a compound ferromagnetic thin-film and conductive thin-film layer combination together on layer 15. This compound thin-film layer is provided to have a net layer magnetization that, when fixed in a selected spatial orientation in the finally formed structure, will resist magnetization rotation, and certainly resist firmly any magnetization rotation therein that could be sufficient to lead to a reversal in its orientation as a result of expected externally applied magnetic fields. Thus, for the finally formed cell structures intended to be used in limited magnetic fields, the magnetization of this compound thin-film layer will appear fixed in its orientation in the device, i.e. "pinned" in a direction relative to the finally formed cell structure which will again be in the plane of FIG. 2B.

This compound thin-layer film is formed by first sputter depositing a ferromagnetic thin-film layer, 16, shown as a dashed line rectangle in FIG. 2B because of being positioned rearward from the section line due to not covering the ends of the layer 15. Layer 16 is of CoFe comprising 95% cobalt and 5% iron to a thickness of 50 Å which layer is deposited in the presence of an easy axis direction determination magnetic field that is aligned with the easy axis direction of the ferromagnetic layers 12 and 14 therebelow. Then a nonmagnetic layer, 17, of Ruthenium is sputter deposited to provide a Ru antiferromagnetic coupling layer of 9 Å thickness shown as a dark dashed line in FIG. 2B. Thereafter, another ferromagnetic layer, 18, of CoFe comprising 95% cobalt and 5% iron is deposited to a thickness of 50 Å, and deposited again in the presence of an easy axis direction determination magnetic field aligned as was the field for layer 16. The resulting compound layers 16, 17, 18 has materials with high spin polarization in its outer layers due to the use of high magnetic induction CoFe therein, but has little total magnetic moment because of the Ru layer provided therebetween which strongly antiferromagnetically couples these outer layer through primarily exchange coupling so that the magnetizations of each are pointed in opposite directions. Thus, this layer is relatively insensitive to externally applied magnetic fields and contributes little to the spatial magnetic fields thereabout. However, the magnetization direction in this composite layer by itself is not very strongly fixed in any direction because of the relatively weak anisotropy exhibited by the CoFe layers.

Thus, a further antiferromagnetic material "pinning" layer exhibiting a substantial magnetic anisotropy must be deposited on layer 18 to strongly set the magnetization direction of compound layer 16, 17, 18 in the direction of the easy axis in layers 12 and 14. Such a layer has a strongly fixed magnetization direction which, through exchange coupling to layer 18, strongly fixes the direction of magnetization of that layer also, and so that of layer 16 through Ru layer 17. The result is an antiferromagnetic layer coupled strongly to compound layer 16, 17, 18 which also provides a high magnetic induction material layer, layer 16, with a corresponding substantial spin polarization against barrier layer 15. Hence, a CrPtMn pinning layer, 19, of 45% chromium, 10% platinum and 45% manganese is sputter deposited on layer 18 to a thickness of 300 Å in the presence of a magnetization axis determination magnetic field aligned with the field used in forming CoFe layers 16 and 18.

Upon completion of this antiferromagnetic magnetization pinning arrangement shown in FIGS. 2B and 2C using these magnetization direction determination layers, a 1000 Å layer of aluminum is sputter deposited on pinning layer 19 to protect what is below, and to allow electrical connections thereto for circuit purposes. The resulting layer, 20, is shown in dashed line form also in FIG. 2B because of its being set back from the section line as seen in FIG. 2A. Again, this layer is shown in FIG. 2B as it will result after the subsequent structure forming steps, and is not shown in FIG. 2C because of its already being clear in FIG. 2B.

Next in this fabrication process, a further layer is deposited on layer 20 to provide an etching termination layer, or stop, for subsequent etching steps. A milling mask layer is next sputter deposited on the etch stop layer to there be prepared for use as a milling mask by being suitably patterned using standard techniques. This last masking pattern is to result, after milling therethrough to remove the exposed ferromagnetic, antiferromagnetic and nonmagnetic layers therebelow, in pinned electrode structures to serve as portions of the corresponding memory cell spin dependent tunneling structures formed in a "sandwich" construction with barrier layer 15 and ferromagnetic thin-film layer 14. This subsequent ion milling step removes the exposed portions of aluminum layer 20, the next exposed portions of pinning layer 19, and then the next exposed portions of the compound layer 16, 17 and 18 down to barrier layer 15 to thereby form the structures of such pinned electrodes.

A second material removal step is then performed to form the barrier and substitute "sandwich" device for each memory cell. Following standard patterning arrangements, ion milling is used to form the substitute "sandwich" devices with the corresponding barrier layer thereover in the form of central rectangular solids with a pair of triangular solids ends on either side thereof along the lengths as shown in FIG. 2A. The pinned electrodes formed above are each positioned on and over just the corresponding central rectangular solid in each memory cell as shown in FIGS. 2A and 2B. A milling mask layer is deposited and patterned in such a way as to form a pattern for an etching mask which is to be formed following that pattern by leaving the desired masking portions of that layer. The unwanted portions of the masking layer are removed down to barrier layer 15 serving as an etch stop.

This last masking pattern is to result, after milling therethrough to remove the exposed barrier layer, ferromagnetic layers and substitute "sandwich" intermediate layer, in a substantial number of substitute "sandwich" device structures to serve as portions of the corresponding memory cells with each such substitute "sandwich" device being in a "sandwich" construction having ferromagnetic layers 12 and 14 on either side of substitute "sandwich" intermediate layer 13, and with barrier layer 15 and the corresponding pinned electrode thereon. The remaining portions of the masking layer serve as the above mentioned milling mask for the subsequent ion milling step which removes the exposed portions of barrier layer 15, and thereafter, also the next exposed portions of ferromagnetic thin-film layer 14, and the then exposed portions of conductive substitute "sandwich" intermediate layer 13, and finally the then exposed portions of ferromagnetic thin-film layer 12 down to insulating layer 11 to thereby form the structure of the substitute "sandwich" devices and complete the structures of the memory cells, 21, as shown in FIG. 2B, and in FIG. 2C without supporting layer 11 on the bottom and protective aluminum layer 20 on top being shown there.

Following the completion of memory cell structures 21, a layer of silicon nitride is sputter deposited over those structures and the exposed portions of insulating layer 11 and barrier layer 15 to a thickness of 1000Å to form another insulating layer. Photoresist is provided over this insulating layer as an etching mask to provide via openings therethrough in a following etching step to form a completed insulating layer, 22, and then through silicon nitride layer 11 to reach appropriate metal interconnection risers extending through other insulating layers in the monolithic integrated circuit therebelow.

On insulating layer 22, so prepared, a further metal deposition is made again of aluminum, but here alloyed with 2% copper, to cover that layer and fill the via openings therein, and in silicon nitride layer 11. This metal layer is deposited to a thickness of 2000 Å typically and patterned in a standard manner to eliminate the unwanted metal layer portions. The structures that result from this elimination are shown in FIG. 2B, and in FIG. 2A, as a plurality of interconnections, 23, for interconnecting memory cell structures 21 to the electronic circuitry in the integrated circuit therebelow through mating with metal interconnection risers extending through insulating layers of that integrated circuit. A further protective electrical insulating layer, 24, of silicon nitride is deposited to cover and protect interconnections 23.

Interconnection 23 extending from memory cell 21 on the left in FIGS. 2A and 2B, and through insulating layer 22, meets an electrical interconnection riser on the left in FIG. 2B by having a portion thereof, 25, extend through silicon nitride layer 11 to reach a plug, 26, of tungsten and be in electrical contact therewith at the upper end of that riser. Plug 26 in turn extends through integrated circuit insulating layer $10^{iv}$ to reach and be in electrical contact with a portion, 27, of the third metal layer of that integrated circuit. This third metal portion is formed of primarily aluminum, and is rearward in FIG. 2B of another interconnection portion, 28, the third metal layer extending from the left edge of the fragmentary view in FIG. 2B to underneath the memory cell structure 21 on the left in that figure. A further aluminum plug, 25', extends from the bottom of the memory cell structure 21 on the left through silicon nitride layer 11 to be in contact with a further tungsten plug, 26', extending through electrical insulating layer $10^{iv}$ to be in contact with third metal layer interconnection portion 28.

Third metal layer interconnection portion 27 is in contact with a further tungsten plug, 29, extending through electrical insulating layer $10'''$ to reach a portion, 30, of the aluminum second metal layer in the integrated circuit. Second metal layer portion 30 is in contact with a further tungsten plug, 31, which extends through electrical insulating layer $10''$ of the integrated circuit to a portion, 32, of the aluminum first metal layer of the integrated circuit.

First metal layer portion 32 is in contact with a final tungsten plug, 33, extending through electrical insulating layer $10'$ of the integrated circuit to reach semiconductor material 10 of that integrated circuit, specifically, to be electrically connected to one of the terminating regions, 34, of a metal-oxide-semiconductor field-effect transistor (MOSFET), 35. Terminating region 34 of transistor 35 is formed of an $n^+$-type conductivity material formed in a p-type conductivity material tub, 36, in n-type conductivity semiconductor material 10. Transistor 35 has a further $n^+$-type conductivity material terminating region, 37, formed in p-type conductivity material tub 36. In addition, transistor 35 has an $n^+$-type conductivity polysilicon gate, 38, between terminating regions 34 and 37 separated from tub 36 by a thin gate oxide, 39.

Terminating region 37 has a tungsten plug, 33', extending through electrical insulating layer $10'$ of the integrated circuit to reach another portion, 32', of the first metal layer of the integrated circuit. In a typical arrangement, first metal layer portion 32' extends to a pad suited for connection to a positive source of voltage, with third metal layer portion 28 connected to a ground reference voltage. In this situation, terminating region 37 serves as a drain for transistor 35 and terminating region 34 serves as a source for transistor 35. If the polarity of the voltage between first metal interconnection layer portion 32' and third metal layer interconnection portion 28 are reversed, terminating region 34 would then serve as the drain for transistor 35 and terminating region 37 would serve as the source. In either situation, memory cell structure 21 on the left in FIG. 2B will have current provided therethrough controlled by transistor 35, and perhaps by others not shown in this figure.

Memory cell 21 on the right in FIGS. 2A and 2B is positioned on an electrical interconnection riser just right of center in FIG. 2B by being in electrical contact with a first plug, 25", of aluminum at the upper end of that riser. Plug 25" extends through silicon nitride layer 11 to reach a second plug, 26", of tungsten which in turn extends through integrated circuit insulating layer $10^{iv}$ to reach and be in electrical contact with another portion, 27', of the aluminum third metal layer of that integrated circuit. Another interconnection portion, 28', of the third metal layer rearward of interconnection portion 28 and portion 27' in FIG. 2B directly interconnects the pair of memory cells 21 at the rearward ends thereof not seen in that figure but which are seen in FIG. 2A.

Third metal layer interconnection portion 27' in FIG. 2B is in contact with a further tungsten plug, 29', extending through electrical insulating layer 10''' to reach another portion, 30', of the aluminum second metal layer in the integrated circuit. Second metal layer portion 30' is in contact with a further tungsten plug, 31', which extends through electrical insulating layer 10'' of the integrated circuit to another portion, 32'', of the aluminum first metal layer of the integrated circuit.

First metal layer portion 32'' is in contact with a final tungsten plug, 33'', extending through electrical insulating layer 10' of the integrated circuit to reach semiconductor material 10 of that integrated circuit, specifically, to be electrically connected to one of the terminating regions, 34', of another MOSFET, 35'. Terminating region 34' of transistor 35' is formed of an n$^+$-type conductivity material formed in a p-type conductivity material tub, 36', in n-type conductivity semiconductor material 10. Transistor 35' has a further n$^+$-type conductivity material terminating region, 37', formed in p-type conductivity material tub 36'. In addition, transistor 35' has an n$^+$-type conductivity polysilicon gate, 38', between terminating regions 34' and 37' separated from tub 36' by a thin gate oxide, 39'.

Terminating region 37' has a tungsten plug, 33''', extending through electrical insulating layer 10' of the integrated circuit to reach another portion, 32''', of the first metal layer of the integrated circuit. In a typical arrangement, first metal layer portion 32''' extends to a pad suited for connection to a positive source of voltage. In this situation, terminating region 37' serves as a drain for transistor 35' and terminating region 34' serves as a source for transistor 35'.

Interconnection 23 extending from memory cell 21 on the right in FIGS. 2A and 2B, and through insulating layer 22, meets an electrical interconnection riser on the right in FIG. 2B by having a portion thereof, 25''', extend through silicon nitride layer 11 to reach a plug, 26''', of tungsten and be in electrical contact therewith at the upper end of that riser. Plug 26''' in turn extends through integrated circuit insulating layer 10$^{iv}$ to reach and be in electrical contact with a portion, 27'', of the aluminum third metal layer of that integrated circuit.

Third metal layer interconnection portion 27'' is in contact with a further tungsten plug, 29'', extending through electrical insulating layer 10''' to reach a portion, 30'', of the aluminum second metal layer in the integrated circuit. Second metal layer portion typically extends to another MOSFET not shown for controlling the voltage and current applied to memory cell 21 on the right in FIG. 2B.

The same equations as the basis for obtaining an approximation of the resulting cell substitute "sandwich" effect device switching magnetic fields threshold and associated currents as were last used above can again be used for the substitute "sandwich" structure device shown in FIGS. 2A, 2B and 2C. Here, however, the thickness of the cell substitute "sandwich" effect device layer farther from the barrier junction can be thickened with respect to the layer closer to the junction, which can be represented by $T_2=N_t T_1$ where $N_t>1$ is the thickness difference multiple which, in the example just described above, equaled three, and can have its effective anisotropy field reduced with respect to the layer closer to the junction, which can be represented by $H_{k2}=N_a H_{k1}$ where $N_a<1$ is the effective anisotropy field difference which, in the example just described above, equaled one third to one fourth. Also, with different materials the magnetization saturation $M_s$ is corresponding set to $M_s$ and $M_{s2}$. Thus, the equations are given again as $$0=T_{q1}=-M_{s1}H_{k1} \sin \theta_1 \cos \theta_1 + M_{s1}H_s S_{f1} \sin \theta_1 - M_{s1}H_{cp} \sin \theta_1 + M_{s1}H_{demagx1} \sin \theta_1 + M_{s1}H_w \cos \theta_1 - M_{s1}H_{demagy1} \cos \theta_1,$$

and $$0=T_{q2}=-M_{s2}H_{k2} \sin \theta_2 \cos \theta_2 + M_{s2}H_s S_{f2} \sin \theta_2 + M_{s2}H_{demagx2} \sin \theta_2 + M_{s2}H_w \cos \theta_2 - M_{s2}H_{demagy2} \cos \theta_2.$$

In obtaining a threshold value from these equations by incrementally increasing the magnetic fields until the magnetization of the free layer switches to the opposite direction, the maximum demagnetization fields are determined using this thickness difference between $T_1$ and $T_2$. "Orange peel" coupling will limit the minimum thickness $T_2$ of the thinner layer because such coupling increases with the inverse of the thickness thereof.

FIG. 2A has a graph imposed thereon shown between aluminum layers 20 over memory cells 21 with the x axis being horizontal to parallel the easy axes of the magnetic layers in those cells and the y axis being vertical. The rotation angle θ of the cell substitute "sandwich" effect device layers magnetizations from the easy axis is shown, and the magnetization of the thinner layer in the absence of magnetic fields is shown oriented primarily leftward to be closely along the x or easy axis with the magnetization of the thicker layer shown oriented primarily upward toward the y axis along the length of the cells.

Thus, even though the easy axis is across the width of memory cells 21 along the x axis, the magnetization of the thicker, and lower anisotropy, substitute "sandwich" effect device layer is primarily directed along the length of the memory cell because of shape anisotropy and reduced material anisotropy to thereby effectively reduce the demagnetization energy and so the device applied magnetic fields switching threshold and the currents needed to provide such fields. This magnetization orientation in the thicker layer primarily along the cell length reduces the magnetization direction switching threshold for the thinner layer because it acts to provide some rotation of that thinner layer magnetization leaving less rotation to be provided by the applied magnetic field. Also, the thicker layer serves as a low reluctance magnetic path, or "keeper", for the fields produce by sense currents through the substitute "sandwich" effect device so that much of the generated field is applied to the thinner layer thereby aiding the rotation of its magnetization. Additional "keeper" structures can be provided for use with any magnetic fields externally applied along the length of the memory cells to reduce the currents needed to provided a selected value of such fields.

As indicated above, the cell substitute "sandwich" structure switching magnetic fields threshold and associated currents can be found by minimizing the device free energy for a cell small enough to have single domain cell substitute "sandwich" structure ferromagnetic layers. The interest here is in the switching thresholds for the relatively freely switching ferromagnetic layers further from the junction barrier with, and without, the benefit of those layers being thicker, or having a lower effective anisotropy field, or both, relative to the pinned ferromagnetic layer closest to junction, the difference in such switching thresholds for the various free layer configurations determining the extent of those benefits. Such a minimization is equivalent to setting the magnetic torques $T_{q2}$ for the layers further from the junction barrier in the substitute "sandwich" structure to zero in the equation therefor near the end of the Background of the Invention section above for the relatively freely switching layer without such modifications, and the last equation above with one or both of such modifications.

Figure 3A:
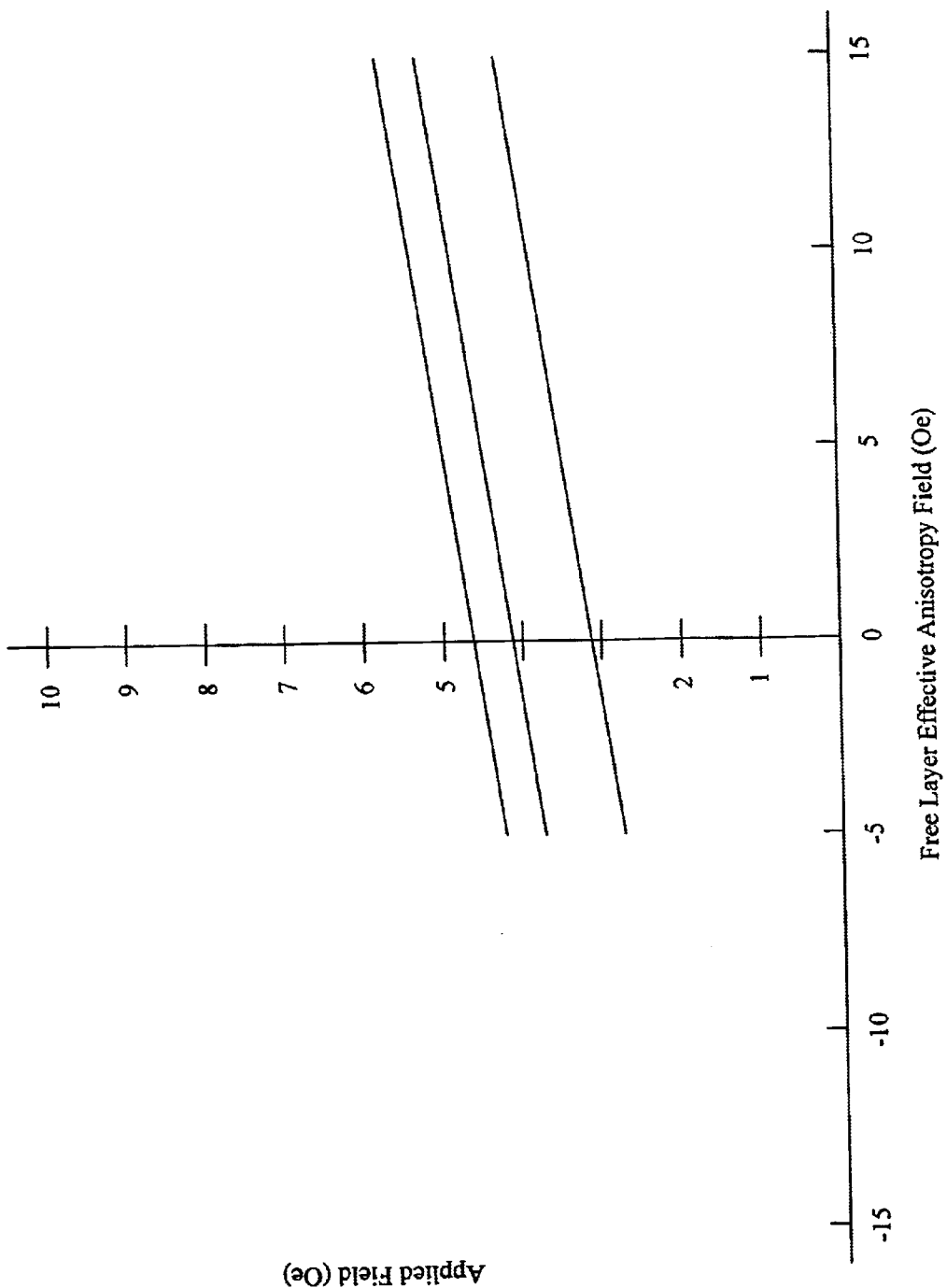
FIGS. 3A, 3B and 3C show graphs with plots representing the behavior of the memory cells shown in FIG. 2 and variations thereof.

FIG. 3A shows is a graph with plots of the outcomes for the switching applied magnetic fields threshold values for the more freely switching ferromagnetic layer in the substitute "sandwich" structure ferromagnetic layers as a function of the effective anisotropy field therein, including the switching applied magnetic fields thresholds values resulting independently for sense current fields due to current provided in that structure (both when the layers coupling field aids—middle plot—and opposes—top plot—the applied switching field) and independently for word line fields—bottom plot—due to current provided in an adjacent word line conductor (in the situation of such a conductor being provided). These results are for a substitute "sandwich" structure that is 1.0 μm wide with $M_{s1}$=1000 emu, $M_{s2}$=800 emu, $H_{k1}$=15 Oe, $H_{dx1}$=$H_{dx2}$=50 Oe, $H_{dy1}$=$H_{dy2}$=1 Oe, $H_{cp}$=1 Oe, and $S_{f1}$=$S_{f2}$=0.85. In addition, the first ferromagnetic layer (layer 1) in this structure is an alloy of 65% nickel, 15% iron and 20% cobalt that is 40 Å thick, the intermediate layer in this structure is of Ru that is 50 Å thick, and the second ferromagnetic layer (layer 2) in this structure is an alloy of nickel and iron that is 50 Å thick but in varying in relative compositions of each to thereby provide the varying values of the effective anisotropy field plotted. The reduction in switching magnetic fields thresholds values with smaller effective anisotropy fields can be easily seen. The negative values shown for the effective anisotropy field in the plots are the equivalent of the easy axis of the second layer being oriented along the length rather than along the width.

Figures 3B, 3C:
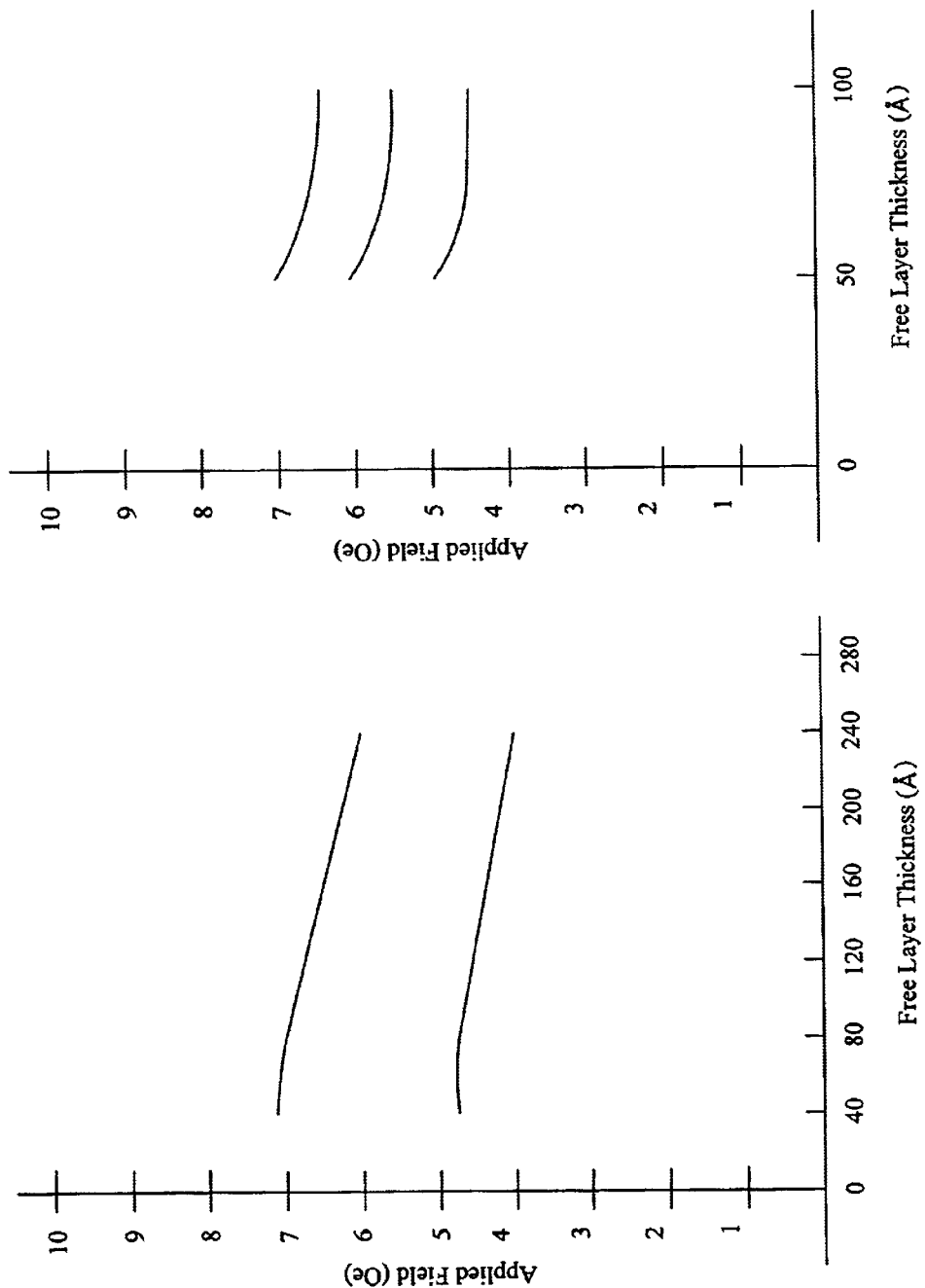

FIG. 3B shows is a graph with plots of the outcomes for the switching applied magnetic fields threshold values for the more freely switching ferromagnetic layer in the substitute "sandwich" structure ferromagnetic layers as a function of the thickness of that layer, including the switching applied magnetic fields thresholds values resulting independently for both sense current fields due to current provided in that structure (with the layers coupling field opposing the switching applied magnetic field)—top plot—and for word line fields—bottom plot—due to current provided in an adjacent word line conductor (in the situation of such a conductor being provided). These results are again for a substitute "sandwich" structure that is 1.0 μm wide with $M_{s1}$=1000 emu, $M_{s2}$=800 emu, $H_{k1}$=15 Oe, $H_{k2}$=15 Oe, $H_{dx1}$=50 Oe, $H_{dx2}$=50 to 100 Oe, $H_{dy1}$=$H_{dy2}$=1 Oe, $H_{cp}$=1 Oe, and $S_{f1}$=$S_{f2}$=0.85. Again, the first ferromagnetic layer (layer 1) in this structure is an alloy of 65% nickel, 15% iron and 20% cobalt that is 40 Å thick, the intermediate layer in this structure is of Ru that is 50 Å thick, and the second ferromagnetic layer (layer 2) in this structure is an alloy comprising 65% nickel, 15% iron and 20% cobalt or a little less of each if 0 to 2% of molybdenum is to be added to this thicker layer to increase electrical resistivity so as to keep currents approximately equal in each ferromagnetic layer in the giant magnetoresistive effect device of the cell despite thickness differences. This last layer varies from 40 Å to 240 Å in thickness to thereby provide the varying values of the thickness plotted. The reduction in switching magnetic fields thresholds values with greater second layer thickness can be easily seen.

FIG. 3C shows is a graph with plots of the outcomes for the switching applied magnetic fields threshold values for the more freely switching ferromagnetic layer in the substitute "sandwich" structure ferromagnetic layers as a function both of the thickness of that layer and of the effective anisotropy field therein, including the switching applied magnetic fields thresholds values resulting independently for sense current fields due to current provided in that structure (both when the layers coupling field aids—middle plot—and opposes—top plot—the applied switching field) and independently for word line fields—bottom plot—due to current provided in an adjacent word line conductor (in the situation of such a conductor being provided). These results are here too for a substitute "sandwich" structure that is 1.0 μm wide with $M_{s1}$=1000 emu, $M_{s2}$=800 emu, $H_{k1}$=15 Oe, $H_{k2}$=5 Oe, $H_{dx1}$=50 Oe, $H_{dx2}$=50 to 100 Oe, $H_{dy1}$=$H_{dy2}$=1 Oe, $H_{cp}$=1 Oe, and $S_{f1}$=$S_{f2}$=0.85. In this situation, the first ferromagnetic layer (layer 1) in this structure is an alloy of 65% nickel, 15% iron and 20% cobalt that is 40 Å thick, the intermediate layer in this structure is of Ru that is 50 Å thick, and the second ferromagnetic layer (layer 2) in this structure is an alloy of 80% nickel and 20% iron or a little less of each if 0 to 2% of molybdenum is to be added to this thicker layer to increase electrical resistivity so as to keep currents approximately equal in each ferromagnetic layer in the giant magnetoresistive effect device of the cell despite thickness differences. This last layer can very less in thickness from the other ferromagnetic layer to get an equivalent reduction in thresholds because of the different effective anisotropy fields of each, this last layer varying from 50 Å to 100 Å in thickness to thereby provide the varying values of the thickness plotted. The reduction in switching magnetic fields thresholds values with greater second layer thickness can be readily seen. The negative values shown for the effective anisotropy field in the plots are the equivalent of the easy axis of the second layer being oriented along the length rather than along the width.

Although the present invention has been described with reference to preferred embodiments, workers skilled in the art will recognize that changes may be made in form and detail without departing from the spirit and scope of the invention.

What is claimed is:

1. A ferromagnetic thin-film based digital memory having a memory cell, said memory cell comprising:
   a substrate; and
   a bit structure supported on said substrate comprising:
     a nonmagnetic intermediate layer, said nonmagnetic intermediate layer having two major surfaces on opposite sides thereof; and
     a memory film of an anisotropic ferromagnetic material on each of said nonmagnetic intermediate layer major surfaces but differing from one another on those surfaces as to magnitudes of applied magnetic fields needed to rotate magnetizations thereof over a selected angle;
     an electrically insulative intermediate layer on said memory film and across said memory film from one of said nonmagnetic intermediate layer major surfaces, said electrically insulative intermediate layer having a major surface on a side opposite said memory film; and
     a magnetization reference layer on said major surface of said electrically insulative intermediate layer having a relatively fixed magnetization direction through said memory film having magnetizations which rotate over angles for a selected external magnetic field present thereat greater than that angle over which said magnetization of said magnetization reference layer rotates for said selected external magnetic field present thereat.

2. The apparatus of claim 1 wherein a said memory film and said nonmagnetic intermediate layer have a length along a selected direction and a width substantially perpendicular thereto that is smaller in extent than said length, said memory film in a said bit structure being characterized by an anisotropy field, and said width being sufficiently small that demagnetization fields arising in said memory film in response to its saturation magnetization being oriented along that said width exceed in magnitude said anisotropy field.

3. The apparatus of claim 1 wherein said memory film on at least one of said major surfaces of said nonmagnetic intermediate layer and said nonmagnetic intermediate layer each have a length along a selected direction and a width substantially perpendicular thereto that is smaller in extent than said length and has a shaped end portion extending over a portion of said length in which said width gradually reduces to zero at an end thereof.

4. The apparatus of claim 1 wherein said memory film at each of said major surfaces of said intermediate layer of at least one of said bit structures is arranged such that there are two separate films with one of said separate films on each of said major surfaces.

5. The apparatus of claim 4 further comprising a pair of series electrodes interconnected with manipulation circuitry having each member thereof in electrical contact with a corresponding one of opposite sides of at least one of said two separate memory films, and a barrier electrode interconnected with manipulation circuitry in electrical contact with said magnetization reference layer.

6. The apparatus of claim 5 further comprising a plurality of transistors electrically interconnected in said manipulation circuitry so that said bit structure has a transistor in said plurality of transistors electrically coupled thereto that selectively substantially prevents current in at least one direction along a current path through that bit structure.

7. The apparatus of claim 6 wherein said manipulation circuitry has a plurality of transistors electrically coupled thereto so that there is at least one said transistor electrically connected to a corresponding one of said pair of series electrodes and so that there is at least one said transistor electrically connected to said barrier electrode.

8. The apparatus of claim 4 wherein one of said two separate memory films is thicker than that other one of said two separate memory films by at least 5%.

9. The apparatus of claim 8 wherein that one of said two separate memory films that is thicker is further from said electrically insulative intermediate layer than is that other one of said two separate memory films.

10. The apparatus of claim 4 wherein one of said two separate memory films has a lower effective anisotropy field than that other one of said two separate memory films.

11. The apparatus of claim 10 wherein that one of said two separate memory films that has a lower effective anisotropy field is further from said electrically insulative intermediate layer than is that other one of said two separate memory films.

12. The apparatus of claim 4 wherein one of said two separate memory films is thicker by at least 5% and has a lower effective anisotropy field than that other one of said two separate memory films.

13. The apparatus of claim 12 wherein that one of said two separate memory films that is thicker and has a lower effective anisotropy field is further from said electrically insulative intermediate layer than is that other one of said two separate memory films.

14. The apparatus of claim 4 wherein said bit structure has a length along selected direction and a width substantially perpendicular thereto that is smaller in extent than said length, said width being less than about two curling lengths of said separate films from edges thereof substantially perpendicular to said width.

15. The apparatus of claim 1 wherein said electrically insulative intermediate layer major surfaces adjacent said memory film having a surface area sufficiently large to provide at least that signal-to-noise ratio needed by said information retrieval circuitry to permit determinations thereby of directions of magnetizations of said memory film on each of said intermediate layer surfaces.

16. The apparatus of claim 1 wherein said magnetization reference layer comprises an antiferromagnetic layer positioned at a major surface of a first reference ferromagnetic thin-film layer.

17. The apparatus of claim 16 wherein said magnetization reference layer further comprises a second reference ferromagnetic thin-film layer separated from said first reference ferromagnetic thin-film layer by an antiparallel magnetization directing layer forcing magnetizations of said first and second reference ferromagnetic thin-film layers to be oppositely directed.

18. The apparatus of claim 17 wherein said antiparallel magnetization directing layer is formed of ruthenium.

19. The apparatus of claim 1 further comprising an electrical current conductor positioned across an insulating layer from said magnetization reference layer.

20. A ferromagnetic thin-film based digital memory having a memory cell, said memory cell comprising:
a substrate; and
a bit structure supported on said substrate comprising:
   a nonmagnetic intermediate layer, said nonmagnetic intermediate layer having two major surfaces on opposite sides thereof; and
   two separate memory films of differing anisotropic ferromagnetic materials so as to have with one on each of said nonmagnetic intermediate layer major surfaces but with differing effective anisotropy fields;
   an electrically insulative intermediate layer on said memory film and across said memory film from one of said nonmagnetic intermediate layer major surfaces, said electrically insulative intermediate layer having a major surface on a side opposite said memory film; and
   a magnetization reference layer on said major surface of said electrically insulative intermediate layer having a relatively fixed magnetization direction through said memory film having magnetizations which rotate over angles for a selected external magnetic field present thereat greater than that angle over which said magnetization of said magnetization reference layer rotates for said selected external magnetic field present thereat.

21. The apparatus of claim 20 wherein a said memory film and said nonmagnetic intermediate layer have a length along a selected direction and a width substantially perpendicular thereto that is smaller in extent than said length, said memory film in a said bit structure being characterized by an anisotropy field, and said width being sufficentiy small that demagnetization fields arising in said memory film in response to its saturation magnetization being oriented along that said width exceed in magnitude said anisotropy field.

22. The apparatus of claim 20 wherein said memory film on at least one of said major surfaces of said nonmagnetic intermediate layer and said nonmagnetic intermediate layer each have a length along a selected direction and a width substantially perpendicular thereto that is smaller in extent than said length and has a shaped end portion extending over a portion of said length in which said width gradually reduces to zero at an end thereof.

23. The apparatus of claim 20 wherein said electrically insulative intermediate layer major surfaces adjacent said memory film having a surface area sufficiently large to provide at least that signal-to-noise ratio needed by said information retrieval circuitry to permit determinations thereby of directions of magnetizations of said memory film on each of said intermediate layer surfaces.

24. The apparatus of claim 20 wherein said magnetization reference layer comprises an antiferromagnetic layer positioned at a major surface of a first reference ferromagnetic thin-film layer.

25. The apparatus of claim 24 wherein said magnetization reference layer further comprises a second reference ferromagnetic thin-film layer separated from said first reference ferromagnetic thin-film layer by an antiparallel magnetization directing layer forcing magnetizations of said first and second reference ferromagnetic thin-film layers to be oppositely directed.

26. The apparatus of claim 25 wherein said antiparallel magnetization directing layer is formed of ruthenium.

27. The apparatus of claim 20 further comprising an electrical current conductor positioned across an insulating layer from said magnetization reference layer.

28. The apparatus of claim 20 further comprising a pair of series electrodes interconnected with manipulation circuitry having each member thereof in electrical contact with a corresponding one of opposite sides of at least one of said two separate memory films, and a barrier electrode interconnected with manipulation circuitry in electrical contact with said magnetization reference layer.

29. The apparatus of claim 28 further comprising a plurality of transistors electrically interconnected in said manipulation circuitry so that said bit structure has a transistor in said plurality of transistors electrically coupled thereto that selectively substantially prevents current in at least one direction along a current path through that bit structure.

30. The apparatus of claim 29 wherein said manipulation circuitry has a plurality of transistors electrically coupled thereto so that there is at least one said transistor electrically connected to a corresponding one of said pair of series electrodes and so that there is at least one said transistor electrically connected to said barrier electrode.

31. The apparatus of claim 20 wherein that one of said two separate memory films that has a lower effective anisotropy field is further from said electrically insulative intermediate layer than is that other one of said two separate memory films.

32. A ferromagnetic thin-film based digital memory having a memory cell, said memory cell comprising:
   a substrate; and
   a bit structure supported on said substrate comprising:
      a nonmagnetic intermediate layer, said nonmagnetic intermediate layer having two major surfaces on opposite sides thereof; and
      a memory film of an anisotropic ferromagnetic material on each of said nonmagnetic intermediate layer major surfaces but of thicknesses differing from one another outwardly from those surfaces by at least 5%;
      an electrically insulative intermediate layer on said memory film and across said memory film from one of said nonmagnetic intermediate layer major surfaces, said electrically insulative intermediate layer having a major surface on a side opposite side memory film; and
      a magnetization reference layer on said major surface of said electrically insulative intermediate layer having a relatively fixed magnetization direction through said memory film having magnetizations which rotate over angles for a selected external magnetic field present thereat greater than that angle over which said magnetization of said magnetization reference layer rotates for said selected external magnetic field present thereat.

33. The apparatus of claim 32 wherein a said memory film and said nonmagnetic intermediate layer have a length along a selected direction and a width substantially perpendicular thereto that is smaller in extent than said length, said memory film in a said bit structure being characterized by an anisotropy field, and said width being sufficiently small that demagnetization fields arising in said memory film in response to its saturation magnetization being oriented along that said width exceed in magnitude said anisotropy field.

34. The apparatus of claim 32 wherein said memory film on at least one of said major surfaces of said nonmagnetic intermediate layer and said nonmagnetic intermediate layer each have a length along a selected direction and a width substantially perpendicular thereto that is smaller in extent than said length and has a shaped end portion extending over a portion of said length in which said width gradually reduces to zero at an end thereof.

35. The apparatus of claim 32 wherein said memory film at each of said major surfaces of said intermediate layer of at least one of said bit structures is arranged such that there are two separate films with one of said separate films on each of said major surfaces.

36. The apparatus of claim 35 further comprising a pair of series electrodes interconnected with manipulation circuitry having each member thereof in electrical contact with a corresponding one of opposite sides of at least one of said two separate memory films, and a barrier electrode interconnected with manipulation circuitry in electrical contact with said magnetization reference layer.

37. The apparatus of claim 36 further comprising a plurality of transistors electrically interconnected in said manipulation circuitry so that said bit structure has a transistor in said plurality of transistors electrically coupled thereto that selectively substantially prevents current in at least one direction along a current path through that bit structure.

38. The apparatus of claim 37 wherein said manipulation circuitry has a plurality of transistors electrically coupled thereto so that there is at least one said transistor electrically connected to a corresponding one of said pair of series electrodes and so that there is at least one said transistor electrically connected to said barrier electrode.

39. The apparatus of claim 35 wherein that one of said two separate memory films that is thicker is at least one and one half times as thick as that other one of said two separate memory films.

40. The apparatus of claim 35 wherein that one of said two separate memory films that is thicker is at least two times as thick as that other one of said two separate memory films.

41. The apparatus of claim 35 wherein that one of said two separate memory films that is thicker is at least two times and one half as thick as that other one of said two separate memory films.

42. The apparatus of claim 35 wherein that one of said two separate memory films that is thicker is at least three times as thick as that other one of said two separate memory films.

43. The apparatus of claim 35 wherein said bit structure has a length along selected direction and a width substantially perpendicular thereto that is smaller in extent than said length, said width being less than about two curling lengths of said separate films from edges thereof substantially perpendicular to said width.

44. The apparatus of claim 35 wherein that one of said two separate memory films that is thicker is further from said electrically insulative intermediate layer than is that other one of said two separate memory films.

45. The apparatus of claim 35 wherein that one of said two separate memory films that is thicker is further from said electrically insulative intermediate layer than is that other one of said two separate memory films, and has a lower effective anisotropy field.

46. The apparatus of claim 32 wherein said electrically insulative intermediate layer major surfaces adjacent said memory film having a surface area sufficiently large to provide at least that signal-to-noise ratio needed by said information retrieval circuitry to permit determinations thereby of directions of magnetizations of said memory film on each of said intermediate layer surfaces.

47. The apparatus of claim 32 wherein said magnetization reference layer comprises an antiferromagnetic layer positioned at a major surface of a first reference ferromagnetic thin-film layer.

48. The apparatus of claim 47 wherein said magnetization reference layer further comprises a second reference ferromagnetic thin-film layer separated from said first reference ferromagnetic thin-film layer by an antiparallel magnetization directing layer forcing magnetizations of said first and second reference ferromagnetic thin-film layers to be oppositely directed.

49. The apparatus of claim 48 wherein said antiparallel magnetization directing layer is formed of ruthenium.

50. The apparatus of claim 32 further comprising an electrical current conductor positioned across an insulating layer from said magnetization reference layer.

* * * * *

UNITED STATES PATENT AND TRADEMARK OFFICE
CERTIFICATE OF CORRECTION

PATENT NO. : 6,674,664 B2
DATED : January 6, 2004
INVENTOR(S) : Arthur V. Pohm

It is certified that error appears in the above-identified patent and that said Letters Patent is hereby corrected as shown below:

Column 3,
Line 45, delete "maybe" insert -- may be --

Colunm 4,
Lines 61-64, delete:

" $0 = T_{q1} = -M_s H_{k1} \sin\theta_1 \cos\theta_1 + M_s H_s S_{f1} \sin\theta_1 - M_s H_{cp} \sin\theta_1$
$+ M_s 2500 \dfrac{T}{T+W} \cos\theta_1 \sin\theta_1 + M_s H_w \cos\theta_1 - M_s H_{demagy1} \cos\theta_1,$ "

insert:

-- $0 = T_{q1} = -M_s H_{k1} \sin\theta_1 \cos\theta_1 + M_s H_s S_{f1} \sin\theta_1 - M_s H_{cp} \sin\theta_1$
$+ M_s 12500 \dfrac{T}{T+W} \cos\theta_1 \sin\theta_1 + M_s H_w \cos\theta_1 - M_s H_{demagy1} \cos\theta_1,$ --

Column 20,
Line 58, delete "sufficentiy" insert -- sufficiently --

Column 21,
Line 66, delete "side" insert -- said --

Signed and Sealed this

Twelfth Day of October, 2004

JON W. DUDAS
*Director of the United States Patent and Trademark Office*